United States Patent
Jung et al.

(10) Patent No.: US 7,897,500 B2
(45) Date of Patent: Mar. 1, 2011

(54) METHODS FOR FORMING SILICIDE CONDUCTORS USING SUBSTRATE MASKING

(75) Inventors: Eun-ji Jung, Gyeonggi-do (KR); Dae-yong Kim, Gyeonggi-do (KR); Gil-heyun Choi, Seoul (KR); Byung-hee Kim, Seoul (KR); Woong-hee Sohn, Seoul (KR); Hyun-su Kim, Gyeonggi-do (KR); Jang-hee Lee, Gyeonggi-do (KR); Eun-ok Lee, Gyeonggi-do (KR); Jeong-gil Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 122 days.

(21) Appl. No.: 12/276,562

(22) Filed: Nov. 24, 2008

(65) Prior Publication Data

US 2009/0191699 A1    Jul. 30, 2009

(30) Foreign Application Priority Data

Jan. 30, 2008   (KR) .................. 10-2008-0009681

(51) Int. Cl.
*H01L 21/4763* (2006.01)

(52) U.S. Cl. .............. 438/592; 438/149; 438/631; 257/E21.19

(58) Field of Classification Search .......... 438/592
See application file for complete search history.

(56) References Cited

U.S. PATENT DOCUMENTS

| | | | |
|---|---|---|---|
| 6,660,573 B2 * | 12/2003 | Han | 438/149 |
| 2004/0129981 A1 * | 7/2004 | Kim et al. | 257/368 |
| 2006/0084247 A1 * | 4/2006 | Liu | 438/510 |

FOREIGN PATENT DOCUMENTS

| | | |
|---|---|---|
| JP | 2007-073887 | 3/2007 |
| KR | 1020040006421 A | 1/2004 |
| KR | 1020040028384 A | 4/2004 |

\* cited by examiner

*Primary Examiner*—Ajay K Arora
(74) *Attorney, Agent, or Firm*—Myers Bigel Sibley & Sajovec, P.A.

(57) ABSTRACT

A plurality of spaced-apart conductor structures is formed on a semiconductor substrate, each of the conductor structures including a conductive layer. Insulating spacers are formed on sidewalls of the conductor structures. An interlayer-insulating film that fills gaps between adjacent ones of the insulating spacers is formed. Portions of the interlayer-insulating layer are removed to expose upper surfaces of the conductive layers. Respective epilayers are grown on the respective exposed upper surfaces of the conductive layers and respective metal silicide layers are formed from the respective epilayers.

16 Claims, 8 Drawing Sheets

US 7,897,500 B2

METHODS FOR FORMING SILICIDE CONDUCTORS USING SUBSTRATE MASKING

CROSS-REFERENCE TO RELATED PATENT APPLICATION

This application claims the benefit of Korean Patent Application No. 10-2008-0009681, filed on Jan. 30, 2008, in the Korean Intellectual Property Office, the disclosure of which is incorporated herein in its entirety by reference.

FIELD OF THE INVENTION

The present invention relates to methods of manufacturing semiconductor devices, and more particularly, to methods of manufacturing semiconductor devices using salicidation processes.

BACKGROUND OF THE INVENTION

As semiconductor devices become more highly integrated, conductive patterns in the semiconductor devices and therebetween have generally been reduced to minute sizes. Thus, due to high specific resistance of polysilicon that is commonly used as a wiring material for semiconductor devices, problems such as RC time delay and IR voltage reduction may occur.

In particular, in forming a cell gate of a flash memory device using polysilicon, performance of the flash memory device may be increased by reducing resistance of a word line, which may be achieved by forming a silicide layer on a polysilicon layer that serves as a control gate. However, in a flash memory device having a vertical stack type gate structure that includes a tunnel oxide film, a floating gate, a dielectric film, and a control gate, a length of the gate may be reduced according to a reduced design rule to be 50 nm or less. Thus, it may be even more difficult to form a silicide layer having a thickness sufficient to obtain a required gate resistance.

In order to obtain electrical characteristics desired for a gate electrode of the flash memory device, a control gate having a predetermined thickness may be required. In a gate structure, in order to increase a coupling ratio, which generally is an indicator of the coupling between a floating gate and the control gate when a voltage is applied to the control gate in a program operation, it may be necessary to increase a height of the gate structure according to the reduced design rule, and a gap between gate structures may also be reduced according to the design rule. As a result, an aspect ratio of the gap between the gate structures may increase.

When a metal silicide layer is formed on a plurality of gate structures formed with gaps having a large aspect ratio as described above, various unwanted problems can occur. For example, voids may be formed in an insulating layer between two adjacent gate structures or an undesired metal silicide layer may be formed on a surface of an active region of a semiconductor substrate.

SUMMARY OF THE INVENTION

Some embodiments of the present invention provide methods of manufacturing semiconductor devices. A plurality of spaced-apart conductor structures is formed on a semiconductor substrate, each of the conductor structures including a conductive layer. Insulating spacers are formed on sidewalls of the conductor structures. An interlayer-insulating film that fills gaps between adjacent ones of the insulating spacers is formed. Portions of the interlayer-insulating layer are removed to expose upper surfaces of the conductive layers. Respective epilayers are grown on the respective exposed upper surfaces of the conductive layers and respective metal silicide layers are formed from the respective epilayers. The insulating spacers formed on adjacent ones of the conductor structures may be fused together. The conductive layers may include transistor gate electrodes.

Growing respective epilayers on the respective exposed upper surfaces of the metal layers may include growing the epilayers to a thickness such that a height of upper surfaces of the epilayers with respect to an upper surface of the semiconductor substrate is substantially equal to a height of upper surfaces of the insulating spacers with respect to the upper surface of the semiconductor substrate. In some embodiments, growing respective epilayers on the respective exposed upper surfaces of the metal layers may include growing the epilayers to a thickness such that a height of upper surfaces of the epilayers with respect to an upper surface of the semiconductor substrate is less than a height of upper surfaces of the insulating spacers with respect to the upper surface of the semiconductor substrate.

In further embodiments, the conductive layers include doped polysilicon. The epilayers may include Si, SiGe and/or SiC. The conductive layers may include a polysilicon doped with an impurity to a first concentration and the epilayers may include silicon doped with an impurity to a second concentration different from the first concentration. The second concentration may be lower than the first concentration.

Forming respective metal silicide layers from the respective epilayers may include forming respective metal layers on the respective epilayers and forming the metal silicide layers from the epilayers and the metal layers. The metal layers may include Co, Ni, Ti, Hf, NiTa, and/or NiPt.

Forming a plurality of spaced-apart conductor structures may include sequentially forming a first insulating film, a first conductive layer, a second insulating film, and a second conductive layer on the semiconductor substrate, forming spaced-apart hard mask patterns on the second conductive layer and etching the first insulating film, the first conductive layer, the second insulating film and the second conductive layer using the hard mask patterns as etch masks to form the spaced-apart conductor structures. Removing portions of the interlayer-insulating layer to expose upper surfaces of the conductive layers may include planarizing the interlayer-insulating film and the insulating spacers so that upper surfaces of the interlayer-insulating film and the insulating spacers are at substantially the same level as upper surfaces of the hard mask patterns and removing the hard mask patterns to expose the upper surfaces of the conductive layers.

Forming spaced-apart hard mask patterns may include sequentially forming first hard mask patterns and a second hard mask patterns on each of the respective conductive layers, the first and second hard mask patterns including different materials. Removing portions of the interlayer-insulating layer to expose upper surfaces of the conductive layers may include planarizing the interlayer-insulating film, the insulating spacers and the second hard mask patterns to expose upper surfaces of the first hard mask patterns and removing the first hard mask patterns to expose the upper surfaces of the conductive layers. Removing the hard mask patterns to expose the upper surfaces of the conductive layers may include forming respective recesses overlying the respective conductive structures and bounded by the insulating spacers and growing respective epilayers on the respective exposed upper surfaces of the conductive layers may include growing the epilayers in the recesses. Growing respective epilayers on the respective exposed upper surfaces of the conductive layers may include filling the recesses and growing the epilayers onto upper surfaces of the insulating spacers. Portions of the epilayers on the upper surfaces of the insulating spacers may be removed.

In additional embodiments of the present invention, a semiconductor device is fabricated by forming a plurality of spaced-apart conductor structures on a semiconductor substrate, each of the conductor structures including a conductive layer, covering gaps between the spaced-apart conductor structures with insulating material while leaving upper surfaces of the conductive layers exposed, growing respective epilayers on the respective exposed upper surfaces of the conductive layers and forming respective metal silicide layers from the respective epilayers. Covering gaps between the spaced-apart conductor structures with insulating material may include forming insulating spacers on sidewalls of the conductor structures and forming an interlayer-insulating film that fills gaps between adjacent ones of the insulating spacers. Growing respective epilayers on the respective upper surfaces of the conductive layers may be preceded by removing portions of the interlayer-insulating file to expose the upper surfaces of the conductive layers.

Forming a plurality of spaced-apart conductor structures may include forming a conductive layer on the substrate, forming a plurality of spaced-apart mask patterns on the conductive layer and patterning the conductive layer using the mask patterns as a mask to form the spaced-apart conductor structures. Forming an interlayer-insulating film may include forming the interlayer-insulating layer over the mask patterns and growing respective epilayers on the respective upper surfaces of the conductive layers may be preceded by removing portions of the interlayer-insulating layer and the mask patterns to expose the upper surfaces of the conductive layers. Removing portions of the interlayer-insulating layer and the mask patterns to expose the upper surfaces of the conductive layers may include leaving recesses exposing the upper surfaces of the conductive layers and bounded by the insulating spacers and growing respective epilayers on the respective upper surfaces of the conductive layers may include growing the epilayers in the recesses.

DETAILED DESCRIPTION OF THE INVENTION

Figure 1A:
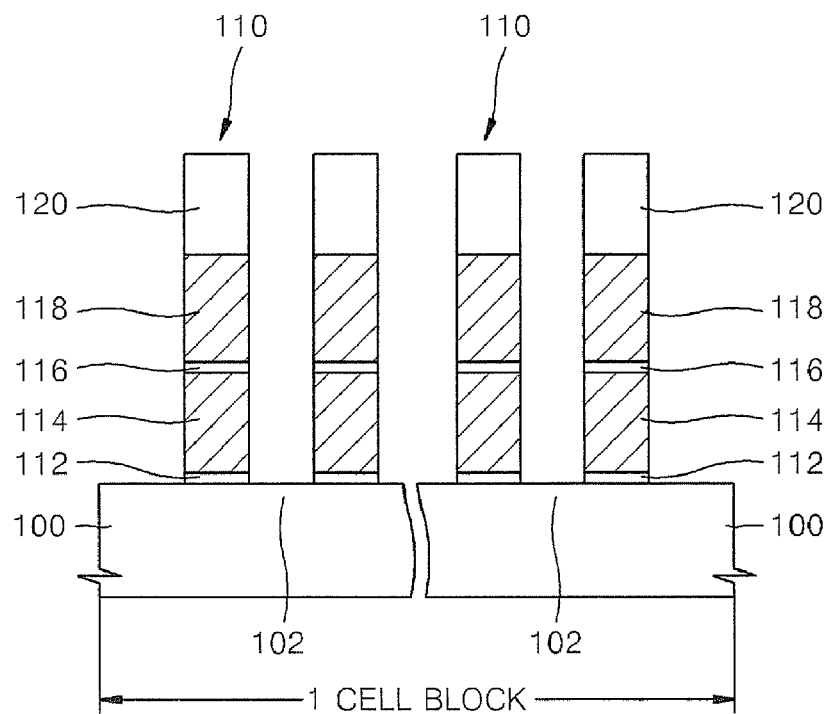
FIGS. 1A through 1F are cross-sectional views illustrating operations for manufacturing a semiconductor device according to some embodiments of the present invention.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being on, connected to and/or coupled to another element or layer, the element or layer may be directly on, connected and/or coupled to the other element or layer, or intervening elements or layers may be present. In contrast, when an element is referred to as being directly on, directly connected to and/or directly coupled to another element or layer, no intervening elements or layers are present. As used herein, the term "and/or" includes any and all combinations of one or more of the associated listed items.

It will also be understood that, although the terms first, second, etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as beneath, below, lower, above, upper, "top," "bottom" and the like, may be used to describe an element and/or features relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprise," "comprising," includes, including, "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the thickness of layers and regions are exaggerated for clarity. It will also be understood that when an element such as a layer, region or substrate is referred to as being "on" another element, it may lie directly on the other element or intervening elements or layers may also be present. Like reference numerals refer to like elements throughout the specification.

FIGS. 1A through 1F are cross-sectional views illustrating operations for manufacturing a semiconductor device according to some embodiments of the present invention. In particular, FIGS. 1A through 1F are cross-sectional views of a portion of one block cell in a cell array region of a flash memory device, in which a plurality of word lines extend in parallel in one direction.

Referring to FIG. 1A, a first insulating film for forming a tunnel oxide film, a first conductive layer for forming a floating gate, a second insulating film for forming an intergate insulating film, and a second conductive layer for forming a control gate are sequentially formed on a semiconductor substrate 100 on which an active region 102 is defined by a device isolation region (not shown). After forming a hard mask pattern 120 on the resultant product, a plurality of spaced apart conductor structures, in particular, gate structures 110, are formed by patterning using the hard mask pattern 120 as an etch mask. Each of the gate structures 110 includes a tunnel oxide film 112, a floating gate 114, an intergate-insulating film 116, and a control gate 118. The gate structures 110 are parts of transistors of memory cells of the flash memory device.

For example, the tunnel oxide film 112 may include a silicon oxide film or a silicon oxynitride film. The floating gate 114 and the control gate 118 may include polysilicon doped with an impurity. The intergate-insulating film 116 may include an oxide-nitride-oxide (ONO) film which is a stacked structure of an oxide film-nitride film-oxide film. The hard mask pattern 120 may include an oxide film, a nitride film, or a combination of these films.

Figure 1B:
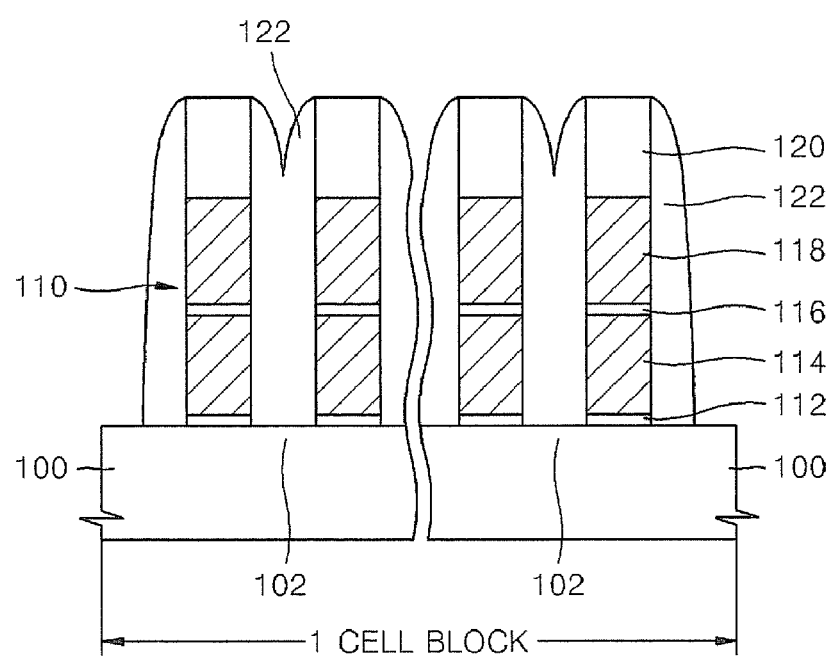

Referring to FIG. 1B, after depositing a third insulating film on the gate structures 110 covered by the hard mask pattern 120 and on the semiconductor substrate 100, insulating spacers 122 are formed on sidewalls of each of the gate structures 110 by performing an etchback using an anisotropic dry etching process. The insulating spacers 122 may include, for example, an oxide film, a nitride film, or a combination of such films. For example, the hard mask pattern 120 may include a nitride film and the insulating spacers 122 may include an oxide film, such as a medium temperature oxide film (MTO) film. In some embodiments, the hard mask pattern 120 may include an oxide film and the insulating spacers 122 may include a nitride film, or the hard mask pattern 120 and the insulating spacers 122 may be each include a nitride film.

In a highly scaled semiconductor device having a minute unit cell size, the gate structures 110 may be disposed with a very small pitch in a cell array region of the semiconductor substrate 100. Thus, a width of the gaps between the gate structures 110 may also be very small. In these embodiments, as depicted in FIG. 1B, two adjacent insulating spacers 122 may be fused together and the active regions 102 of the semiconductor substrate 100 between two adjacent gate structures 110 may be covered. However, embodiments of the present invention are not limited to such an arrangement, i.e., based on the pitch of the gate structures 110 and the gaps between the gate structures 110, the two adjacent insulating spacers 122 may be separated from each other. Also, on gate structures 110 located on either end of one cell bock, an insulating spacer 122 that is not attached to an adjacent insulating spacer 122 may be obtained on sidewalls that face away from the cell block. Source and drain regions (not shown) are formed in the semiconductor substrate 100 of the resultant product on which the gate structures 110 and the insulating spacers 122 are formed by performing an ion injection process on the semiconductor substrate 100.

Figure 1C:
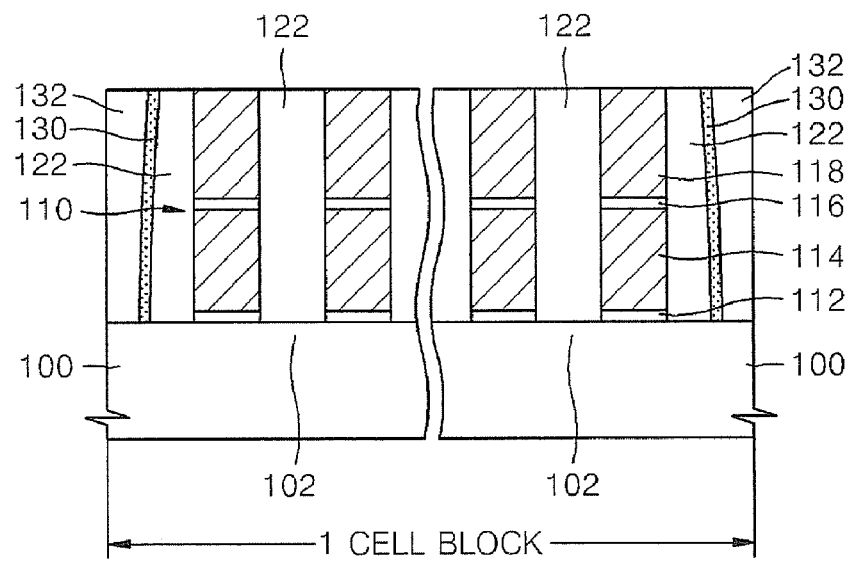

Referring to FIG. 1C, an etch stopper layer 130 and an interlayer-insulating film 132 are sequentially formed on the hard mask pattern 120 that covers the gate structures 110 and the insulating spacers 122. As a result, spaces defined by the insulating spacers 122 in the gate structures 110 are filled with the etch stopper layer 130 and the interlayer-insulating film 132. Afterwards, the interlayer-insulating film 132 is polished by chemical mechanical polishing (CMP) using the etch stopper 130 as an etching stop. The hard mask pattern 120, a portion of the interlayer-insulating film 132, and portions of the insulating spacers 122 are removed using an etch back process and/or a CMP process until upper surfaces of the control gates 118 are exposed.

In FIG. 1C, between the two adjacent gate structures 110, a height from an upper surface of the semiconductor substrate 100 to upper surfaces of the insulating spacers 122 is approximately identical to a height from an upper surface of the semiconductor substrate 100 to upper surfaces of the gate structures 110. However, embodiments of the present invention are not limited thereto. For example, between the two adjacent gate structures 110, the height of the upper surfaces of the insulating spacers 122 may be higher or lower than that of the upper surfaces of the gate structures 110.

Figure 1D:
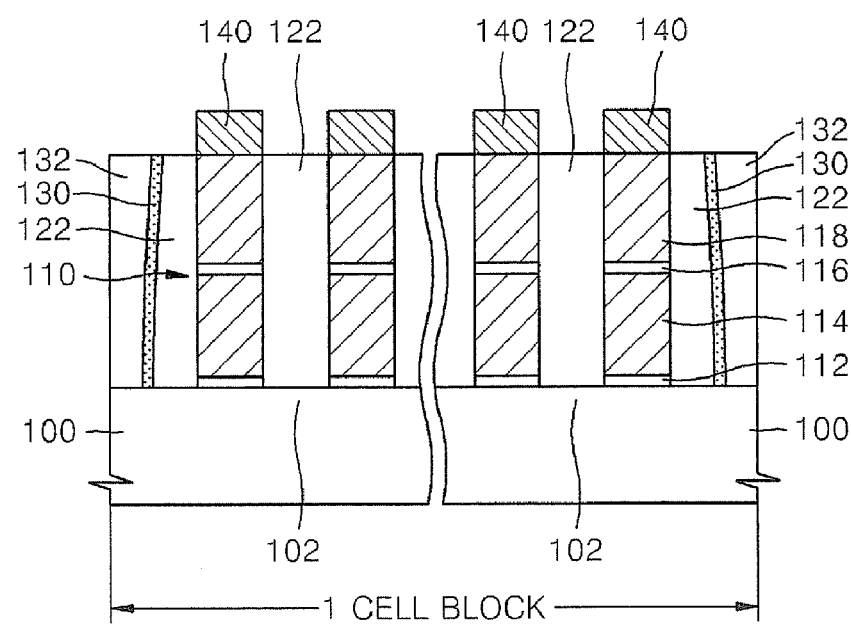

Referring to FIG. 1D, epilayers 140 are selectively formed on the control gates 118 from the exposed surfaces of the control gates 118 by epitaxially growing a material containing Si. The epilayers 140 may include, for example, Si, SiGe, or SiC. Also, the epilayers 140 may be doped with an impurity so that the epilayers 140 can have a doping concentration identical to the doping concentration in the control gates 118 or can have a doping concentration different from that of the control gates 118.

Figure 1E:
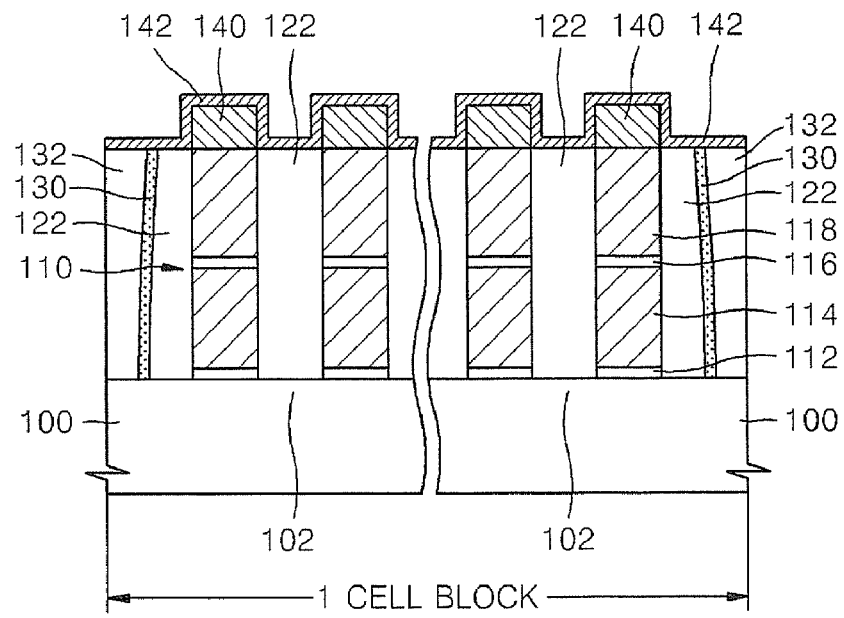

Referring to FIG. 1E, a metal layer 142 is formed on the semiconductor substrate 100 to cover the exposed surfaces of the epilayers 140. The metal layer 142 may include, for example, Co, Ni, Ti, Hf, NiTa, and/or NiPt. The metal layer 142 may be formed using, for example, a physical vapor deposition (PVD) process, a chemical vapor deposition (CVD) process, or an atomic layer deposition (ALD) process.

Figure 1F:
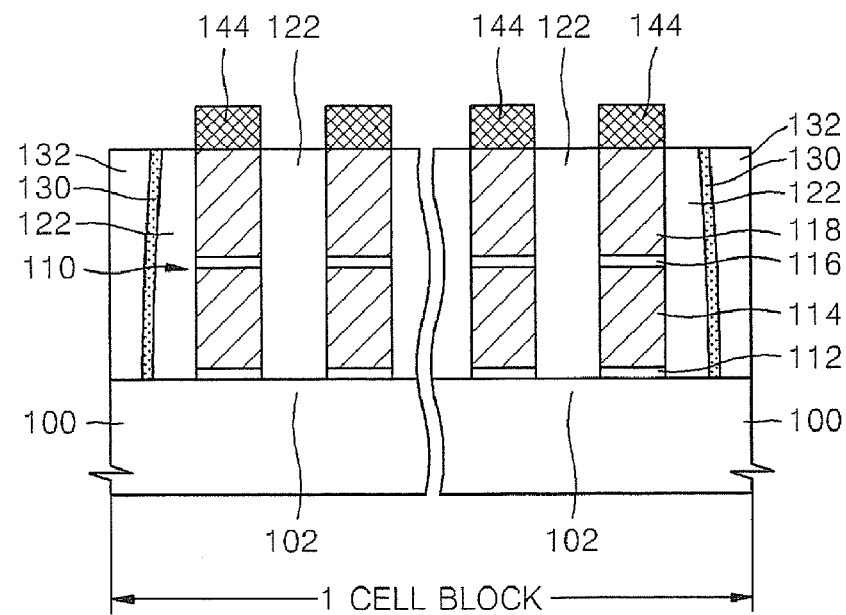

Referring to FIG. 1F, metal silicide layers 144 are formed on the control gates 118 of the gate structures 110 by annealing. The annealing causes a silicide reaction at portions where the metal layer 142 contacts the epilayers 140. Remaining portions of the metal layer 142 that have not reacted may be removed.

A process for forming the metal silicide layers 144 according to some embodiments will now be described. A first annealing is performed with respect to the resultant product on which the metal layer 142 is formed to cause a silicide reaction at portions where the metal layer 142 contacts the epilayers 140, and thus, first phase metal silicide layers are formed on the control gates 118. For example, if the metal layer 142 is formed of Co, then cobalt monosilicide CoSi in a first phase may be formed. After removing unreacted portions of metal layer 142 using a wet etching process, a second annealing process may be performed with respect to the resultant product to change the phase of the metal silicide layers 144 to a second phase. If the metal layer 142 is formed of Co, cobalt disilicide CoSi$_2$ having a low specific resistance may be formed.

A process for forming the metal silicide layers 144 according to further embodiments will now be described. A first annealing is performed with respect to the resultant product on which the metal layer 142 is formed to cause a silicide reaction at portions where the metal layer 142 contacts the epilayers 140, and thus, first phase metal silicide layers are formed on the control gates 118. After performing the first annealing, metal silicide layers are formed in-situ by performing a second annealing with respect to the first phase metal silicide layers. The first annealing may be performed at a temperature of 300 to 600° C. The second annealing may be performed at a temperature lower than that of the first annealing, for example, 200 to 300° C. Afterwards, unreacted portions of the metal layer 142 may be removed, and a third annealing process may be performed with respect to the metal silicide layers that are secondarily annealed. The third annealing may be performed at a temperature of, for example, 300 to 600° C. As a result of the third annealing, metal silicide layers 144 having a low specific resistance may be obtained.

A process for forming the metal silicide layers 144 according to still further embodiments will now be described. In these embodiments, a capping layer (not shown), for example, a TiN capping layer, may be formed on the metal layer 142 for preventing the metal layer 142 from being oxidized. A first annealing is performed with respect to the resultant product on which the metal layer 142 and a capping layer (not shown) covering the metal layer 142 are formed to cause a silicide reaction at portions where the metal layer 142 contacts the epilayers 140. Thus, first phase metal silicide layers are formed on the control gates 118. After performing the first annealing, metal silicide layers are formed in-situ by performing a second annealing with respect to the first phase metal silicide layers. The first annealing may be performed at a temperature of 300 to 600° C. The second annealing may be performed at a temperature lower than that of the first annealing, for example, 200 to 300° C. Afterwards, unreacted portions of the metal layer 142 may be removed. At this point, the capping layer may also be removed. Afterwards, the specific resistance of the metal silicide layers 144 may be lowered by performing a third annealing process. The third annealing may be performed at a temperature of, for example, 300 to 600° C.

In order to control the thickness of the metal silicide layers so that the metal silicide layers are silicided only to the depth of the epilayers 140 when the metal silicide layers 144 are formed, a difference between the concentration of dopant in the control gates 118 of the gate structures 110 and the concentration of the dopant in the epilayers 140 can be used. For this purpose, the epilayer 140s, for example, may have a doping concentration lower than that of the control gates 118. Thus, interfaces between the control gates 118 and the epilayers 140 may act as reaction stopping layers that may limit the silicidation reaction due to doping concentration differences in each of the control gates 118. Although not shown, the manufacture of a desired semiconductor device may be completed by forming an interlayer-insulating film on the resultant product on which the metal silicide layers 144 are formed and forming metal wires on the interlayer-insulating film.

According to the foregoing embodiments of the present invention described with reference to FIGS. 1A through 1F, in order to form the metal silicide layers 144 on the control gates 118, after additionally forming the epilayers 140 on the control gates 118 without siliciding the control gates 118, the epilayers 140 are metal silicided. The process for forming the epilayers 140 and the process for forming the metal silicide layers 144 by metal siliciding the epilayers 140 are performed while surfaces of the active regions 102 of the semiconductor substrate 100 between the gate structures 110 are covered by the insulating spacers 122 or by the insulating spacers 122 and the interlayer-insulating film 132. Also, in a case in which defects such as pitting or voids exist in the insulating spacers 122 and the interlayer-insulating film 132 that cover the active regions 102 of the semiconductor substrate 100, an additional process such as an etchback or a wet etching may not be included for forming the metal silicide layers 144. Thus, during forming of the metal silicide layers 144, the exposure of the surfaces of the semiconductor substrate 100 due to the pitting or voids can be reduced or prevented. Thus, the metal silicide layers 144 may be formed on desired locations while preventing the formation of metal silicide on the active regions 102 of the semiconductor substrate 100. Also, even though gaps between the gate structures 110 may be very small and may have a very high aspect ratio, metal silicide layers 144 having a desired thickness may be formed at desired locations.

In forming the metal silicide layers 144 on the control gates 118, the control gates 118 are not metal silicided. Epilayers 140 are additionally formed on the control gates 118. Afterwards, the metal silicide layers 144 are formed by performing a metal silicidation process involving the epilayers 140. Thus, a height of an etch mask for ensuring an etch resistance may be reduced since a height of the structure to be etched during performing a dry etching for forming the gate structures 110 is reduced. Also, an aspect ratio of the gaps between the gate structures 110 may be reduced due to the reduction of the height of the structure to be etched. Thus, the possibility of defects such as voids in the gaps between the gate structures 110 occurring during the formation of the insulating spacers 122 may be reduced.

FIGS. 2A through 2F are cross-sectional views illustrating operations for manufacturing a semiconductor device according to some embodiments of the present invention. In FIGS. 2A through 2F, like in FIGS. 1A through 1F, a portion of one cell block in which a plurality of word lines of a cell array of a flash memory device extend in parallel in one direction is depicted. In FIGS. 2A through 2F, like reference numerals indicate like elements in FIGS. 1A through 1F. Thus, detailed descriptions thereof will not be repeated.

Figure 2A:
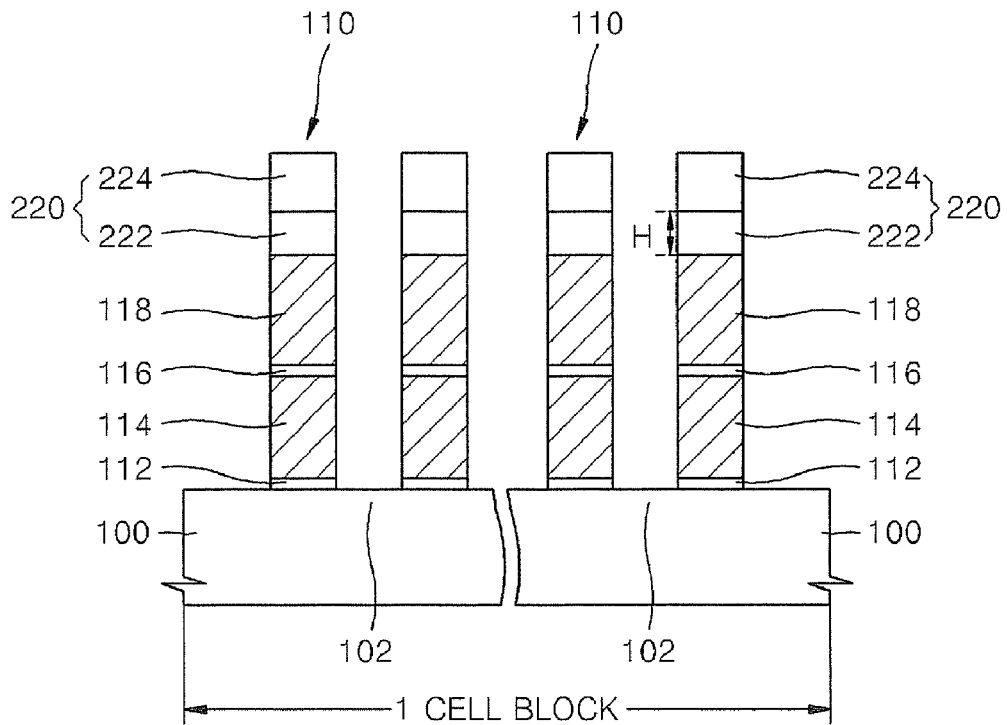
FIGS. 2A through 2F are cross-sectional views illustrating operations for manufacturing a semiconductor device according to further embodiments of the present invention.

Referring to FIG. 2A, as described with reference to FIG. 1A, a plurality of gate structures 110 are formed on a semiconductor substrate 100. Each of the gate structures 110 includes a tunnel oxide film 112, a floating gate 114, an intergate-insulating film 116, and a control gate 118 sequentially formed on the semiconductor substrate 100. However, in the current embodiment, hard mask patterns 220 including at least two different kinds of films are used as an etch mask for forming the gate structures 110. In FIG. 2A, it is depicted that the hard mask patterns 220 has a stacked structure including a first hard mask pattern 222 and a second hard mask pattern 224. However, embodiments of the present invention are not limited thereto. The hard mask patterns 220 may have a stacked structure including three or more different kinds of films.

In the hard mask patterns 220 of FIG. 2A, for example, the first hard mask patterns 222 may include a nitride film, and the second hard mask patterns 224 may include an oxide film, or vice versa. Also, in the hard mask patterns 220 shown in FIG. 2A, the first hard mask patterns 222 may have a height H equal to or lower than a height of epilayers (corresponding to the epilayers 140 of FIG. 1D) to be formed on the control gates 118 of the gate structures 110 in a subsequent process.

Figure 2B:
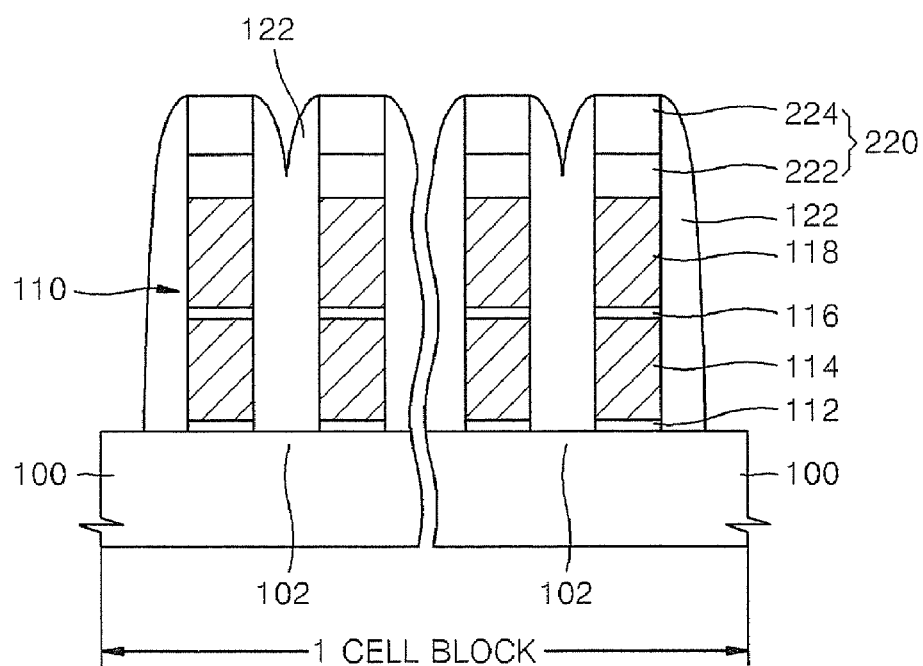

Referring to FIG. 2B, insulating spacers 122 are formed on sidewalls of each of the gate structures 110 using, for example, the operation described with reference to FIG. 1B. For example, if the first hard mask patterns 222 of the hard mask patterns 220 include a nitride film, the insulating spacers 122 may include an oxide film. Also, if the first hard mask patterns 222 of the hard mask patterns 220 include an oxide film, the insulating spacers 122 may include a nitride film. Source and drain regions (not shown) may be formed in the semiconductor substrate 100 by, for example, impurity ion injection into the semiconductor substrate 100.

Figure 2C:
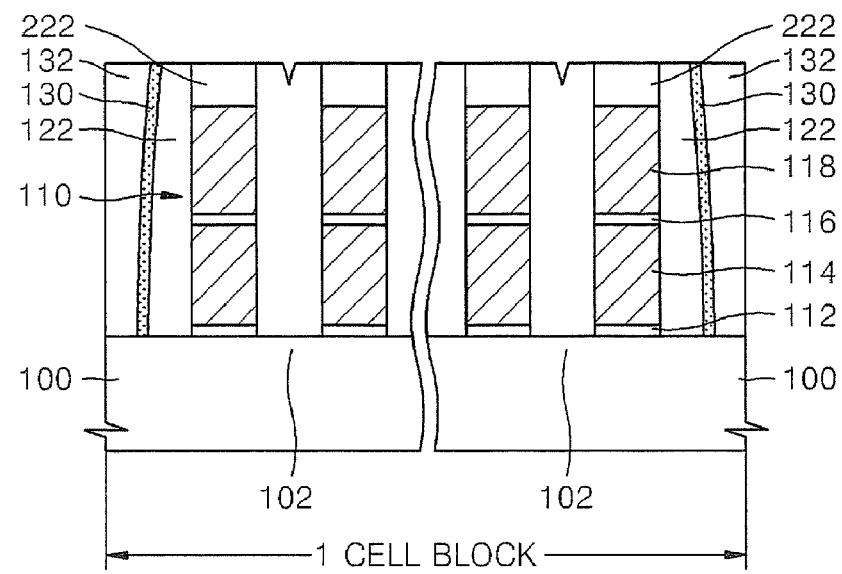

Referring to FIG. 2C, after sequentially forming an etch stopper 130 and an interlayer-insulating film 132 on the hard mask patterns 220 and the insulating spacers 122 that cover the gate structures 110, the interlayer-insulating film 132 is polished by a CMP process using the etch stopper 130. Afterwards, the second hard mask patterns 224, portions of the interlayer-insulating film 132, and portions of the insulating spacers 122 are removed using an etch back process or a CMP process until upper surfaces of the first hard mask patterns 222 are exposed.

Figure 2D:
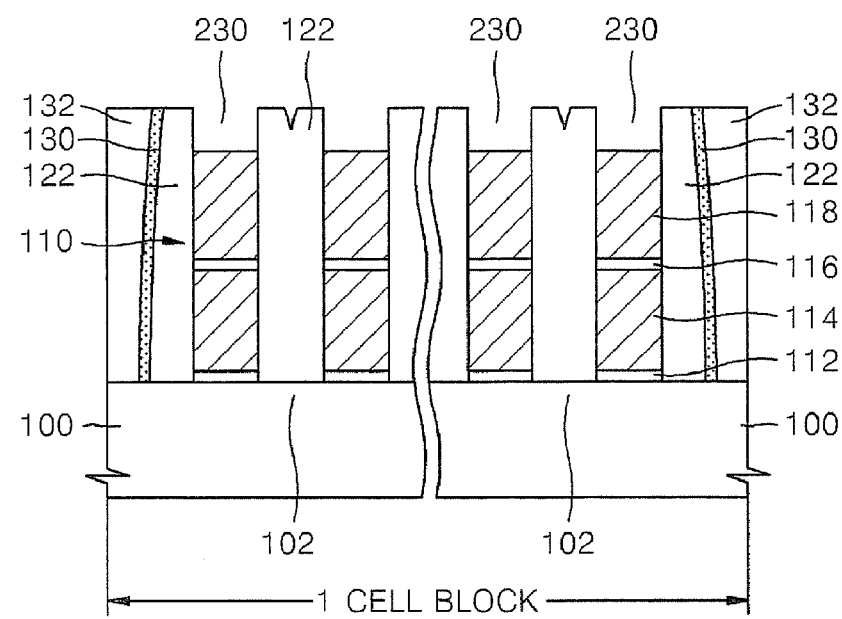

Referring to FIG. 2D, upper surfaces of the control gates 118 are exposed by selectively removing the first hard mask patterns 222. As a result, recesses 230 bounded by the insulating spacers 122 are formed on the control gates 118, exposing the upper surfaces of the control gates 118. In order to selectively remove the first hard mask patterns 222, a wet etching process or a dry etching process may be used.

Figure 2E:
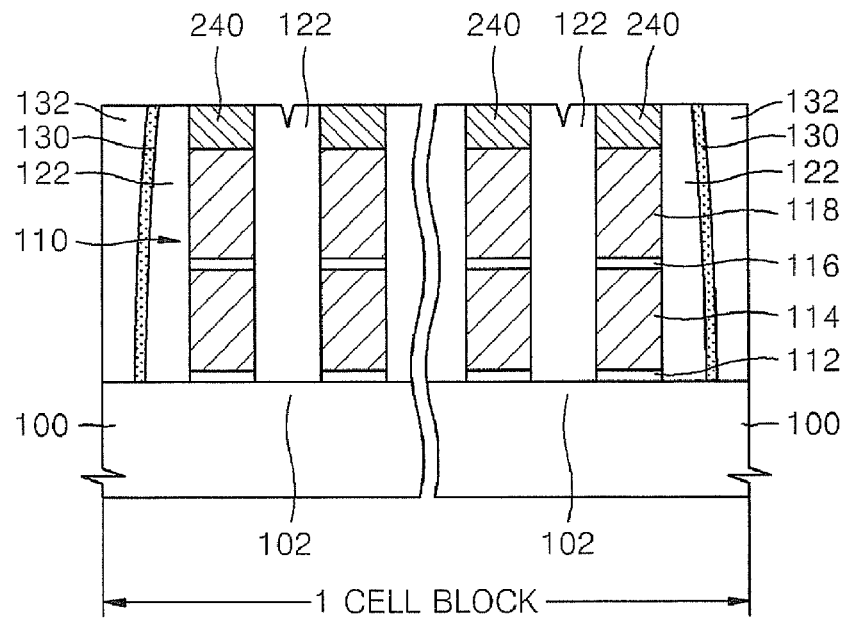

Referring to FIG. 2E, epilayers 240 are selectively formed on the control gates 118 by epitaxially growing a material containing Si from the exposed surfaces of the control gates 118 using, for example, operations described with reference to FIG. 1D. The epilayers 240 are epitaxially grown within the recesses 230 bounded by the insulating spacers 122 on the control gates 118. Thus, there is little or no possibility of short circuits occurring between adjacent epilayers 240 owing to a lateral epitaxial growth of the epilayers 240. After the epilayers 240 are epitaxially grown to approximately the height of an upper surface of the insulating spacers 122 or higher, the epilayers 240 may be epitaxially grown in the lateral direction to cover the upper surfaces of the insulating spacers 122. If necessary, the epilayers 240 may be confined to the recesses 230 by removing portions of the epilayers 240 that cover the upper surfaces of the insulating spacers 122 using a CMP process or an etchback process. Also, if necessary, as long as a distance between adjacent epilayers 240 is maintained such that there is little or no possibility of causing a short circuit, the epitaxially grown epilayers 240 may be formed to a level higher than the upper surfaces of the insulating spacers 122. The epilayers 240 may include Si, SiGe, or SiC. Also, the epilayers 240 may be doped to have a doping concentration equal to or different from the doping concentration in the control gates 118.

Figure 2F:
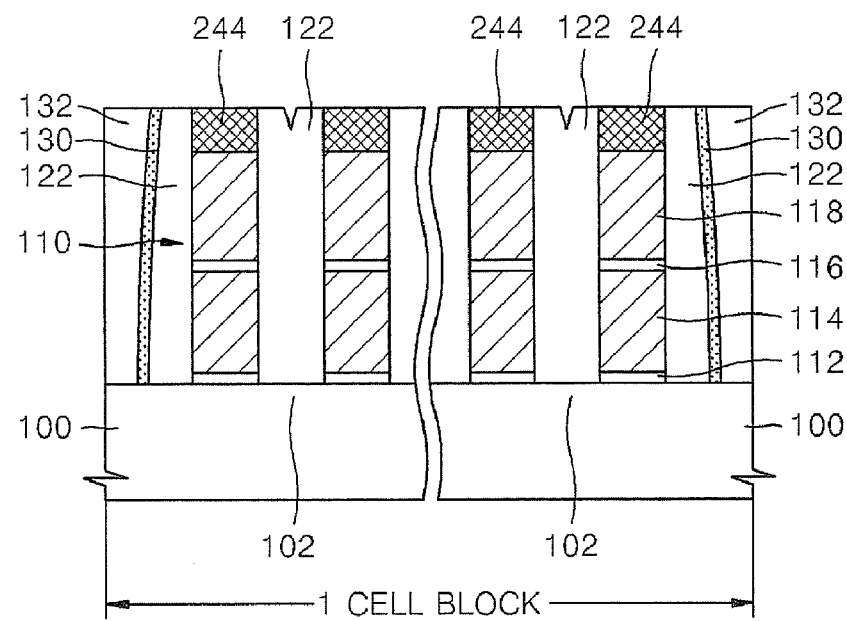

Referring to FIG. 2F, metal silicide layers 244 are formed from the epilayers 240 by forming a metal layer 142 on the epilayers 240 using, for example, the processes described with reference to FIGS. 1E and 1F. Although not shown, prior to forming the metal layer 142 on the epilayers 240, portions of the insulating spacers 122 that cover sidewalls of the epilayers 240 may further be removed so that the sidewalls of the epilayers 240 are exposed. In these embodiments, a metal silicidation process may be performed in which the metal layer 142 covers the upper surface of the epilayers 240 as well as the sidewalls of the epilayers 240.

Figure 3A:
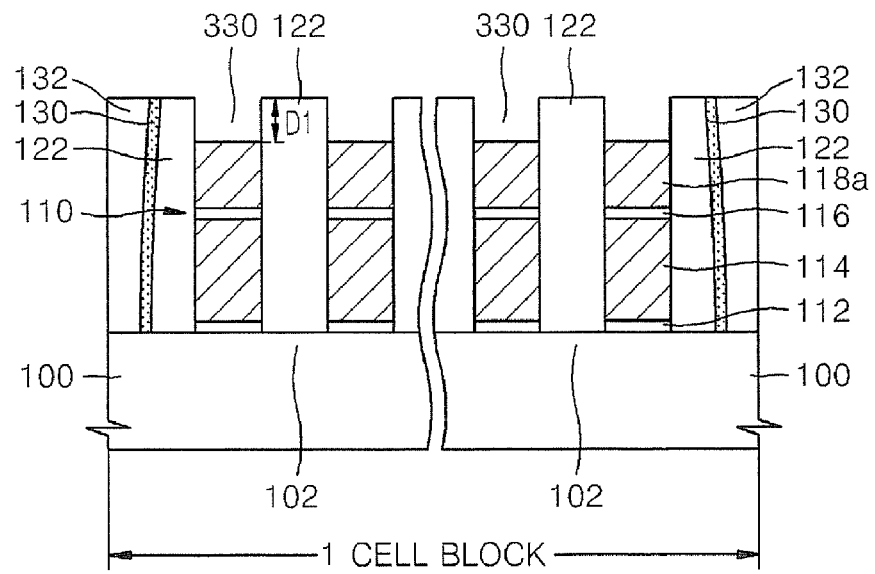
FIGS. 3A through 3C are cross-sectional views illustrating operations for manufacturing a semiconductor device according to some embodiments of the present invention.
Figure 3B:
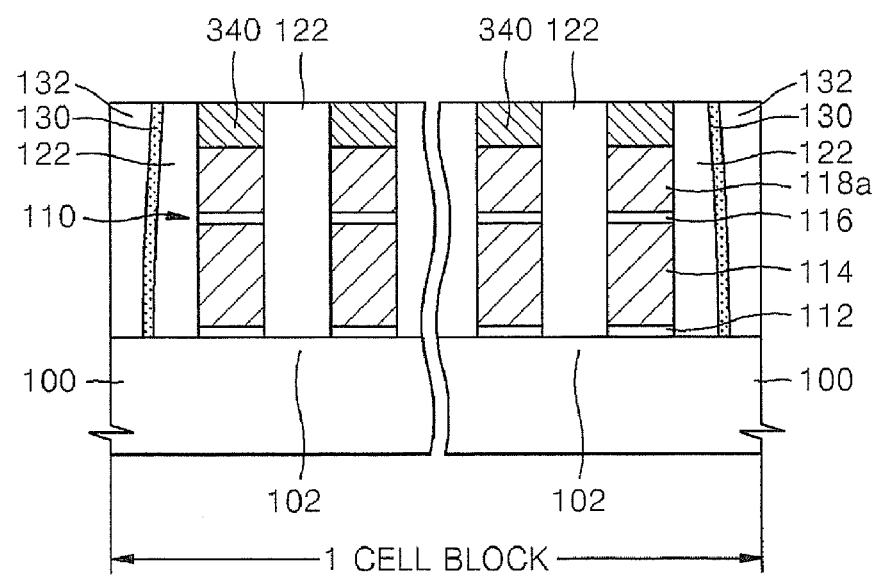
Figure 3C:
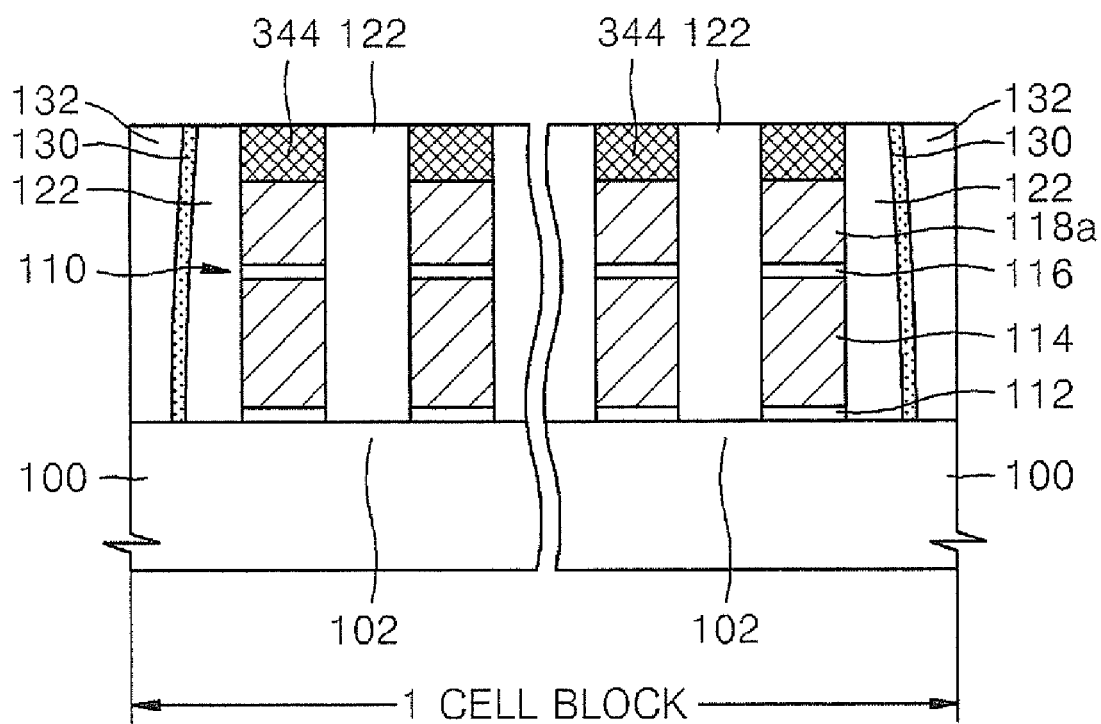

FIGS. 3A through 3C are cross-sectional views illustrating operations for manufacturing a semiconductor device according to some embodiments of the present invention. In FIGS. 3A through 3C, like in FIGS. 1A through 1F, a portion of one cell block in which a plurality of word lines of a cell array of a flash memory device extend in parallel in one direction is depicted. In FIGS. 3A through 3C, like reference numerals indicate like elements in FIGS. 1A through 1F. Thus, detailed descriptions thereof will not be repeated.

Referring to FIG. 3A, using, for example, the processes described with reference to FIGS. 1A through 1F, a plurality of gate structures 110, a plurality of insulating spacers 122 that cover sidewalls of the gate structures 110, and a planarized interlayer-insulating film 132 are formed on a semiconductor substrate 100. Afterwards, control gates 118a are formed by removing portions of control gates 118 exposed at upper parts of the gate structures 110. Recesses 330 bounded by the insulating spacers 122 are formed on the control gates 118a. In order to form the recesses 330, portions of the control gates 118 may be removed to a predetermined depth D1 using, for example, a wet etching process or a dry etching process. The recesses 330 may have a depth D1 equal to or lower than a height of epilayers (corresponding to the epilayers 140 of FIG. 1D) to be formed on the control gates 118a in a subsequent process. The upper surfaces of the control gates 118a are exposed through the recesses 330.

Referring to FIG. 3B, epilayers 340 are selectively formed on the control gates 118a by epitaxially growing a material containing Si from the exposed surfaces of the control gates 118a using, for example, the process described with reference to FIG. 2E. The epilayers 340 are epitaxially grown in the recesses 330 on the control gates 118a. Thus, there is little or no possibility of causing a short circuit between adjacent epilayers 340 due to the lateral growth of the epilayers 340. After the epilayers 340 are epitaxially grown to a height of upper surfaces of the insulating spacers 122 or higher, the epilayers 340 may be epitaxially grown in the lateral direction to cover the upper surfaces of the insulating spacers 122. At this point, if necessary, the epilayers 340 may be confined to the recesses 330 by removing portions of the epilayers 340 that cover the upper surfaces of the insulating spacers 122 using a CMP process or an etchback process. Also, if necessary, the epitaxially grown epilayers 340 may be formed to a level higher than the upper surfaces of the insulating spacers 122 in the recesses 330. The epilayers 340 may include, for example, Si, SiGe, or SiC. Also, the epilayers 340 may have a doping concentration equal to or different from the doping concentration of the control gates 118. Afterwards, metal silicide layers 344 are formed from the epilayers 340 using, for example, the process described with reference to FIGS. 1E and 1F.

Prior to forming the metal layer 142 on the epilayers 340, portions of the insulating spacers 122 that cover sidewalls of the epilayers 340 may be removed so that the sidewalls of the epilayers 340 are exposed. In these embodiments, a metal silicidation process may be performed on the metal layer 142 that covers the upper surface of the epilayers 340 as well as the sidewalls of the epilayers 340.

According to some embodiments of the present invention, in order to form a metal silicide layer on a control gate, a portion of the control gate is not silicided, and instead an epilayer is additionally formed on the control gate. Afterwards, a metal silicide layer is formed by performing a metal silicidation process involving the epilayer. During formation of the epilayer and the silicidation of the epilayer, a surface of an active region of a semiconductor substrate may be covered by an insulating film. Thus, even if defects such as pitting or voids are present in the insulating film that covers the active region of the semiconductor substrate, it may not be necessary to etchback or wet etch the insulating layer that covers the active region of the semiconductor substrate to perform the metal silicidation process on the epilayer. Thus, the metal silicide layer can be formed at desired locations while preventing unwanted formation of metal silicide on the active region of the semiconductor substrate. Also, even though gaps between the gate structures may be very small and have a very large aspect ratio, a metal silicide layer having a desired thickness and shape can be formed at desired locations.

Also, according to some embodiments of the present invention, in forming a metal silicide layer on the control gate, the control gate is not metal silicided and an epilayer is additionally formed on the control gate. Afterwards, the metal silicide layer is formed by performing a metal silicidation process with respect to the epilayer. Thus, a height of an etch mask for ensuring a desired etch resistance may be reduced since a height of a structure to be etched during the performing of a dry etching for forming the gate structures can be reduced. Also, an aspect ratio of the gaps between the gate structures may be reduced due to the reduction of the height of the structure to be etched. Therefore, the possibility of defects such as voids being present in the gaps between the gate structures may be reduced during the forming of the insulating spacers that cover sidewalls of the gate structures.

While embodiments of the present invention have been particularly shown and described, it will be understood by those of ordinary skill in the art that various changes in form and details may be made therein without departing from the spirit and scope of the present invention as defined by the following claims.

What is claimed is:

1. A method of manufacturing a semiconductor device comprising:
   forming a plurality of spaced-apart conductor structures on a semiconductor substrate, each of the conductor structures comprising a conductive layer;
   forming insulating spacers on sidewalls of the conductor structures;
   forming an interlayer-insulating film that fills gaps between adjacent ones of the insulating spacers;
   removing portions of the interlayer-insulating layer to expose upper surfaces of the conductive layers;
   growing respective epilayers on the respective exposed upper surfaces of the conductive layers, wherein growing respective epilayers on the respective exposed upper surfaces of the metal layers comprises growing the epilayers to a thickness such that a height of upper surfaces of the epilayers with respect to an upper surface of the semiconductor substrate is substantially equal to a height of upper surfaces of the insulating spacers with respect to the upper surface of the semiconductor substrate; and
   forming respective metal silicide layers from the respective epilayers.

2. The method of claim 1, wherein insulating spacers formed on adjacent ones of the conductor structures are fused together.

3. The method of claim 1, wherein in the conductive layers comprise transistor gate electrodes.

4. The method of claim 1, wherein the conductive layers include doped polysilicon.

5. The method of claim 1, wherein the epilayers include Si, SiGe and/or SiC.

6. The method of claim 1, wherein the conductive layers include a polysilicon doped with an impurity to a first concentration and wherein the epilayers include silicon doped with an impurity to a second concentration different from the first concentration.

7. The method of claim 6, wherein the second concentration is lower than the first concentration.

8. The method of claim 6, wherein forming respective metal silicide layers from the respective epilayers comprises:
   forming respective metal layers on the respective epilayers; and
   forming the metal silicide layers from the epilayers and the metal layers.

9. The method of claim 8, wherein the metal layers comprise Co, Ni, Ti, Hf, NiTa, and/or NiPt.

10. A method of manufacturing a semiconductor device comprising:
    forming a plurality of spaced-apart conductor structures on a semiconductor substrate, each of the conductor structures comprising a conductive layer;
    forming insulating spacers on sidewalls of the conductor structures;
    forming an interlayer-insulating film that fills gaps between adjacent ones of the insulating spacers;
    removing portions of the interlayer-insulating layer to expose upper surfaces of the conductive layers;
    growing respective epilayers on the respective exposed upper surfaces of the conductive layers, wherein growing respective epilayers on the respective exposed upper surfaces of the metal layers comprises growing the epilayers to a thickness such that a height of upper surfaces of the epilayers with respect to an upper surface of the semiconductor substrate is less than a height of upper surfaces of the insulating spacers with respect to the upper surface of the semiconductor substrate; and
    forming respective metal silicide layers from the respective epilayers.

11. A method of manufacturing a semiconductor device comprising:
    forming a plurality of spaced-apart conductor structures on a semiconductor substrate, each of the conductor structures comprising a conductive layer, wherein forming a plurality of spaced-apart conductor structures comprises:
       sequentially forming a first insulating film, a first conductive layer, a second insulating film, and a second conductive layer on the semiconductor substrate;
       forming spaced-apart hard mask patterns on the second conductive layer; and
       etching the first insulating film, the first conductive layer, the second insulating film and the second conductive layer using the hard mask patterns as etch masks to form the spaced-apart conductor structures;
    forming insulating spacers on sidewalls of the conductor structures;
    forming an interlayer-insulating film that fills gaps between adjacent ones of the insulating spacers;
    removing portions of the interlayer-insulating layer to expose upper surfaces of the conductive layers, wherein removing portions of the interlayer-insulating layer to expose upper surfaces of the conductive layers comprises:
       planarizing the interlayer-insulating film and the insulating spacer so that upper surfaces of the interlayer-insulating film and the insulating spacer are at substantially the same level as upper surfaces of the hard mask patterns; and
       removing the hard mask patterns to expose the upper surfaces of the conductive layers;

growing respective epilayers on the respective exposed upper surfaces of the conductive layers; and forming respective metal silicide layers from the respective epilayers.

12. The method of claim 11, wherein removing the hard mask patterns to expose the upper surfaces of the conductive layers comprises forming respective recesses overlying the respective conductive structures and bounded by the insulating spacers and wherein growing respective epilayers on the respective exposed upper surfaces of the conductive layers comprises growing the epilayers in the recesses.

13. The method of claim 12, wherein growing respective epilayers on the respective exposed upper surfaces of the conductive layers comprises filling the recesses and growing the epilayers onto upper surfaces of the insulating spacers and wherein the method further comprises removing portions of the epilayers on the upper surfaces of the insulating spacers.

14. A method of manufacturing a semiconductor device comprising:

forming a plurality of spaced-apart conductor structures on a semiconductor substrate, each of the conductor structures comprising a conductive layer, wherein forming a plurality of spaced-apart conductor structures comprises:

sequentially forming a first insulating film, a first conductive layer, a second insulating film, and a second conductive layer on the semiconductor substrate;

forming spaced-apart hard mask patterns on the second conductive layer, wherein forming spaced-apart hard mask patterns comprises sequentially forming first hard mask patterns and second hard mask patterns on the respective conductive layers, the first and second hard mask patterns comprising different materials; and etching the first insulating film, the first conductive layer, the second insulating film and the second conductive layer using the hard mask patterns as etch masks to form the spaced-apart conductor structures;

forming insulating spacers on sidewalls of the conductor structures;

forming an interlayer-insulating film that fills gaps between adjacent ones of the insulating spacers;

removing portions of the interlayer-insulating layer to expose upper surfaces of the conductive layers, wherein removing portions of the interlayer-insulating layer to expose upper surfaces of the conductive layers comprises:

planarizing the interlayer-insulating film, the insulating spacers and the second hard mask patterns to expose upper surfaces of the first hard mask patterns; and removing the first hard mask patterns to expose the upper surfaces of the conductive layers;

growing respective epilayers on the respective exposed upper surfaces of the conductive layers; and forming respective metal silicide layers from the respective epilayers.

15. A method of manufacturing a semiconductor device comprising:

forming a plurality of spaced-apart conductor structures on a semiconductor substrate, each of the conductor structures comprising a conductive layer, wherein forming a plurality of spaced-apart conductor structures comprises:

forming a conductive layer on the substrate;

forming a plurality of spaced-apart mask patterns on the conductive layer; and patterning the conductive layer using the mask patterns as a mask to form the spaced-apart conductor structures;

covering gaps between the spaced-apart conductor structures with insulating material while leaving upper surfaces of the conductive layers exposed, wherein covering gaps between the spaced-apart conductor structures with insulating material comprises:

forming insulating spacers on sidewalls of the conductor structures; and forming an interlayer-insulating film that fills gaps between adjacent ones of the insulating spacers, wherein forming an interlayer-insulating film comprises forming the interlayer-insulating layer over the mask patterns;

growing respective epilayers on the respective exposed upper surfaces of the conductive layers, wherein growing respective epilayers on the respective upper surfaces of the conductive layers is preceded by removing portions of the interlayer-insulating film and the mask patterns to expose the upper surfaces of the conductive layers; and forming respective metal silicide layers from the respective epilayers.

16. The method of claim 15:

wherein removing portions of the interlayer-insulating layer and the mask patterns to expose the upper surfaces of the conductive layers comprises leaving recesses exposing the upper surfaces of the conductive layers and bounded by the insulating spacers; and wherein growing respective epilayers on the respective upper surfaces of the conductive layers comprises growing the epilayers in the recesses.

* * * * *